US008857828B1

(12) United States Patent
San Clemente

(10) Patent No.: US 8,857,828 B1
(45) Date of Patent: Oct. 14, 2014

(54) FIELD ACCESS STATION

(71) Applicant: Performance Contracting, Inc., Lenexa, KS (US)

(72) Inventor: Thomas M. San Clemente, Roseville, CA (US)

(73) Assignee: Performance Contracting, Inc., Lenexa, KS (US)

( * ) Notice: Subject to any disclaimer, the term of this patent is extended or adjusted under 35 U.S.C. 154(b) by 0 days.

(21) Appl. No.: 13/909,113

(22) Filed: Jun. 4, 2013

Related U.S. Application Data

(60) Provisional application No. 61/669,926, filed on Jul. 10, 2012.

(51) Int. Cl.
*B25H 1/02* (2006.01)
*B62B 5/00* (2006.01)

(52) U.S. Cl.
CPC ............ *B62B 5/0013* (2013.01); *Y10S 248/918* (2013.01)
USPC ..................... 280/47.35; 312/249.8; 312/327; 248/918

(58) Field of Classification Search
CPC ..... B62B 5/0013; B62B 2202/56; B25H 1/02
USPC .............. 280/47.34, 47.35, 70.11; 248/441.1, 248/917, 918; 312/10.1, 21, 249.8, 249.9, 312/249.11, 223.1, 223.2, 223.3, 223.5, 312/326, 327
See application file for complete search history.

(56) References Cited

U.S. PATENT DOCUMENTS

| 7,114,733 | B2* | 10/2006 | Downs ........................ 280/47.35 |
| 8,162,330 | B2* | 4/2012 | Melkumyan et al. ...... 280/47.34 |
| 8,474,834 | B2* | 7/2013 | Abel et al. .................. 280/47.34 |
| 8,662,605 | B2* | 3/2014 | McRorie et al. ............. 312/276 |
| 2007/0029746 | A1* | 2/2007 | Brennan, Jr. ................ 280/47.26 |
| 2007/0228680 | A1* | 10/2007 | Reppert et al. ............. 280/47.35 |
| 2008/0312491 | A1* | 12/2008 | Smith et al. .................... 600/28 |

OTHER PUBLICATIONS

Knaack LLC brochure "Field Stations—Model 119-01 Field Station" 2 pages Apr. 22, 2012.
BIM Kiosk, www.BIMKiosk.com, 2 page brochure—prior to Jul. 10, 2012.
Rolling cabinet distributed by Knaack LLC—prior to Jul. 10, 2012.
Mobile Security Computer Cabinet With Rear Access Door & Slidout Shelf brochure—globalindistrial.com (pp. 317-318)—prior to Jul. 10, 2012.

* cited by examiner

*Primary Examiner* — John Walters
*Assistant Examiner* — Brian Swenson
(74) *Attorney, Agent, or Firm* — Womble Carlyle Sandridge & Rice LLP

(57) ABSTRACT

A field access station for housing and protecting an electronic display system in a sealed compartment in a first configuration and in a positively-pressurized compartment having a controlled outflow flow of filtered air in a second configuration.

5 Claims, 11 Drawing Sheets

FIELD ACCESS STATION

CROSS-REFERENCE TO RELATED APPLICATIONS

This application claims the benefit of U.S. Provisional Patent Application No. 61/669,926, filed Jul. 10, 2012.

INCORPORATION BY REFERENCE

The disclosure of U.S. Provisional Patent Application No. 61/669,926, which was filed on Jul. 10, 2012, is hereby incorporated by reference for all purposes as if presented herein in its entirety.

BACKGROUND

The present invention relates generally to field access stations for electronic equipment, and in particular to movable or field access stations for electronic and other equipment that are configured for use at construction work sites and other high-dust environments.

As with many other highly-competitive industries, the construction industry is seeking to continuously improve its business practices. This is particularly pertinent as relating to the storage, access and display of construction documents in electronic format, especially large-format construction drawings. The capability of comfortably and easily reviewing, creating, editing and updating blueprints and other electronic documents in a field location holds the promise of substantial cost savings by both reducing the turn-around time for sharing information and by eliminating the costs of printing and maintaining multiple hardcopies.

SUMMARY OF THE INVENTION

The present disclosure seeks to overcome problems presented in the prior art by providing a movable or mobile field station for large-format electronic equipment and the like, and which also provides a convenient viewing and work station, protects the electronic equipment from damage during normal, daily use and provides an extra layer of protection and security during after-hours storage.

BRIEF DESCRIPTION OF THE DRAWINGS

These and various other advantages, features, and aspects of the present invention will become apparent and more readily appreciated from the following detailed description of the embodiments taken in conjunction with the accompanying drawings, as follows.

Figure 1:
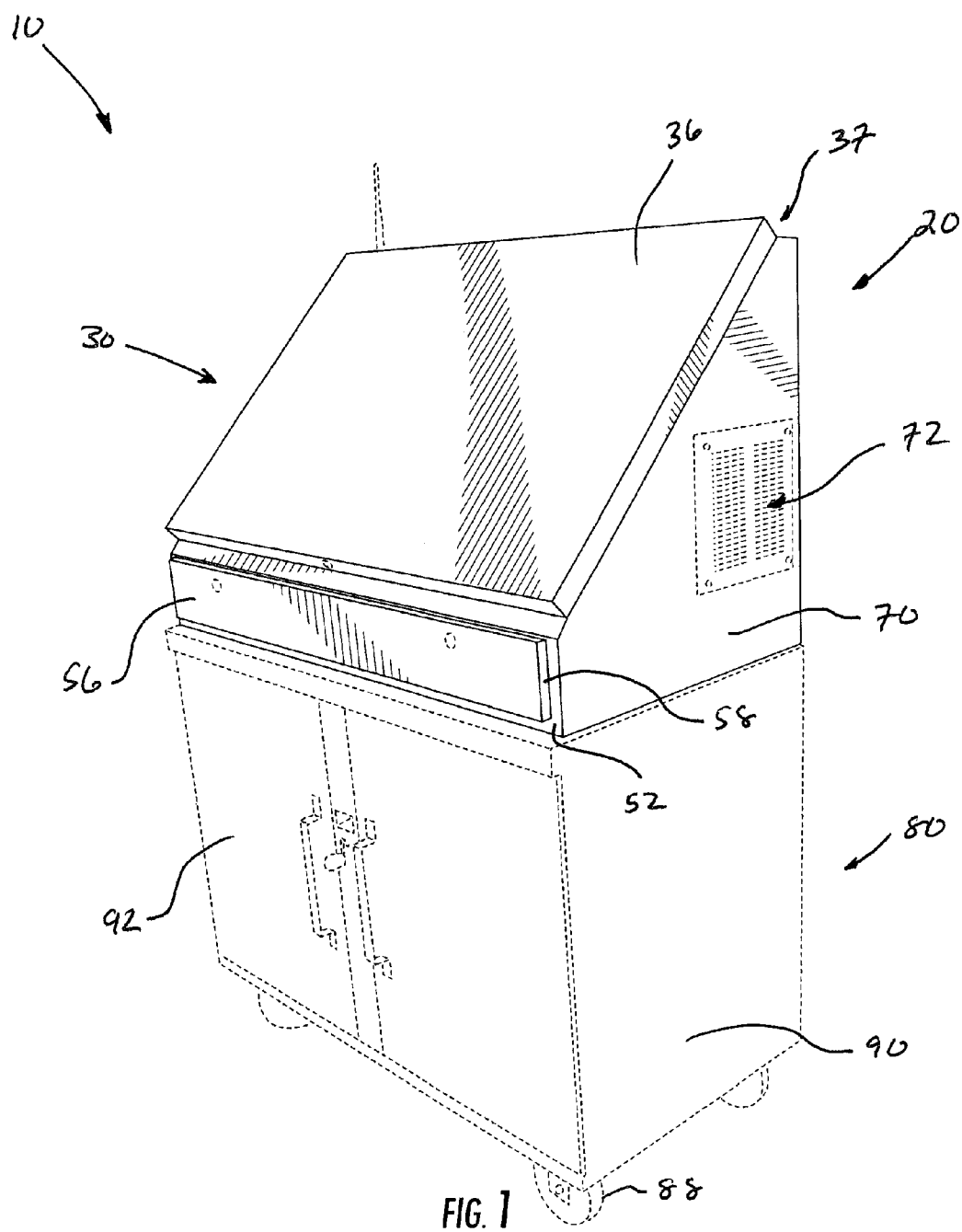
FIG. 1 is a perspective front view of a movable field access station in a closed and sealed configuration, in accordance with a representative embodiment of the disclosure.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

The following description is provided as an enabling teaching of exemplary embodiments. Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. In other words, features from one embodiment or aspect may be combined with features from any other embodiment or aspect in any appropriate combination. For example, any individual or collective features of method aspects or embodiments may be applied to apparatus, product or component aspects or embodiments and vice versa. Accordingly, those who work in the art will recognize that many modifications and adaptations to the embodiments described are possible and may even be desirable in certain circumstances, and are a part of the invention. Thus, the following description is provided as an illustration of the principles of the embodiments and not in limitation thereof, since the scope of the invention is to be defined by the claims.

Illustrated in FIGS. 1-11 is a representative embodiment of a field access station 10 for housing and protecting electronic equipment from a high-dust or similarly-harsh environment for electronics, during both after-hours storage and normal use. Such surroundings are often found at construction sites and at certain manufacturing facilities, where dust from spray-applied fire resistant material (SFRM), blown insulation, paint aerosols, dry dirt and the like can find its way into electronic equipment and the associated components to cause pre-mature failure. As described below, the field access station of the present disclosure provides several significant advantages and benefits over other devices and methods for housing and protecting electronic equipment. However, the recited advantages are not meant to be limiting in any way, as one skilled in the art will appreciate that other advantages may also be realized upon practicing the present invention.

In addition, Appendix A containing FIGS. A-01 through A-43 is attached herewith, and by this reference is incorporated in its entirety herein. Reference will be made to FIGS. A-01 through A-43 on occasion throughout this detailed description, in which various features and aspects of the present disclosure are shown in more detail. Also, Appendix B contains FIGS. B-01 through B-34 and also demonstrates features of this disclosure and by this reference is incorporated in its entirety.

FIGS. 1-6 show the exemplary embodiment of the field access station 10 in a closed and sealed configuration, such as when it would be prepared for after-hours storage on a construction job site. FIGS. 7-11 show the same field access station 10 in an open, ready-for-use configuration.

Referring first to FIGS. 1-6, the field access station 10 includes an enclosure 20 having a front panel 30, side panels 70, a back panel 74, and a top panel 78. In some aspects the enclosure 20 may also include a bottom panel (not shown). Each of the panels is connected along its edges to an adjacent panel with a continuous or sealed joint, so that together the plurality of panels form the sealed enclosure 20 which surrounds and defines a central interior compartment.

The front panel 30 of the enclosure 20 can include an angled portion 32 having a screen cover 36 which closes about a screen aperture, and a vertical portion 52 having a tray cover 56 which closes about a tray aperture. The screen cover 36 includes a raised edge or lip 38 around its perimeter which contacts the face of the angled portion 22 to form a loose seal. In some embodiments, the raised lip 38 can include a sealing strip to form a tighter seal again the face of the angled portion when the screen cover 36 is closed.

In one aspect, the angled portion 32 can be oriented at any acute angle relative to horizontal that is less than 90 degrees. In another aspect, the angled portion 32 can be orientated at an acute angle ranging from about 35 degrees to about 55 degrees relative to horizontal.

The tray cover 56 can also include a raised edge or lip 58 around its perimeter which contacts the face of the vertical portion 52 to form a loose seal. In some embodiments, the raised lip 58 can include a sealing strip to form a tighter seal again the face of the vertical portion 52 when the tray cover 56 is closed. Both the screen cover 36 and the tray cover 56 can also be locked into their closed positions to provide a layer of security against the elements and thieves or vandals.

Figure 2:
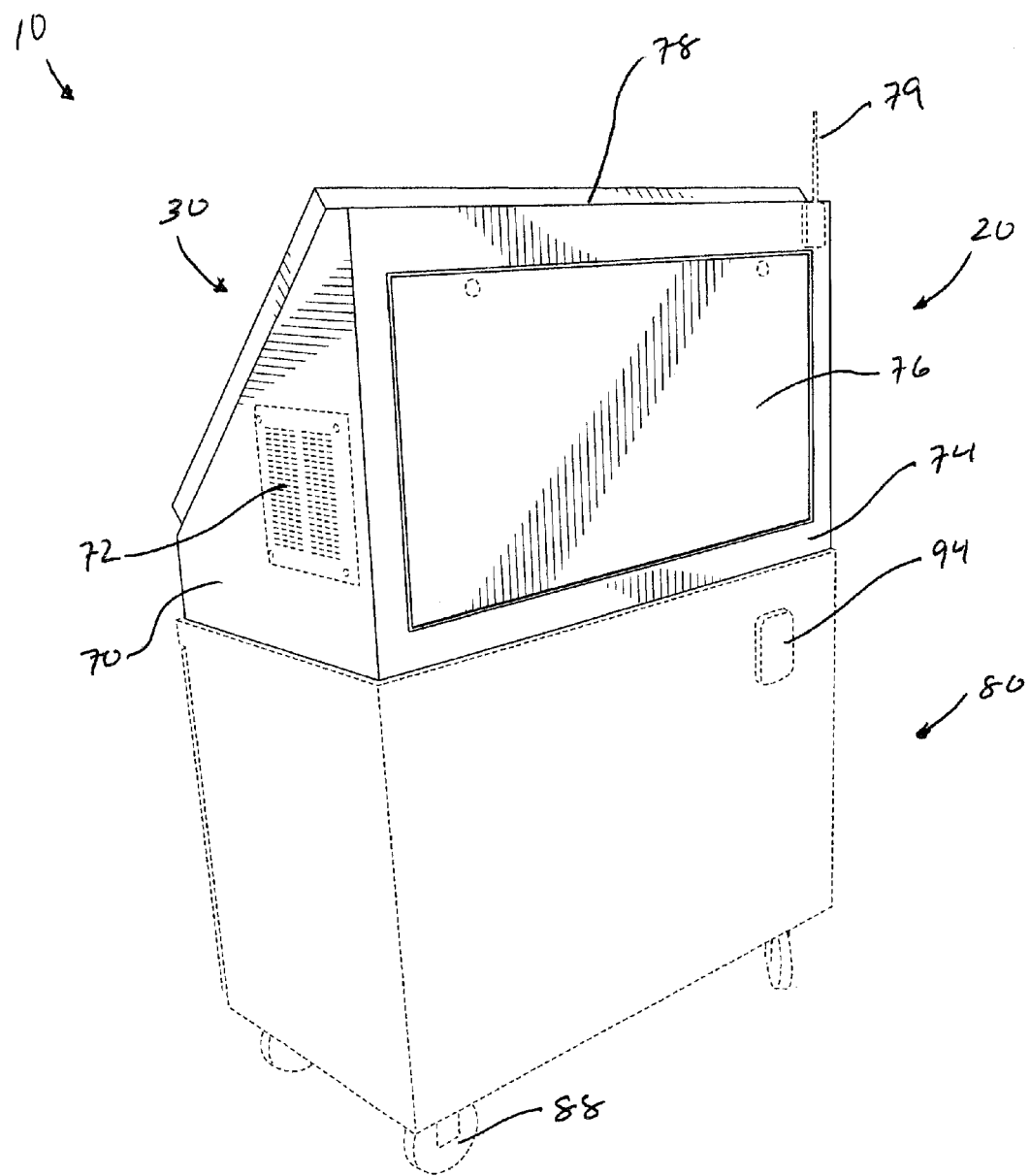
FIG. 2 is a perspective rear view of the field access station of FIG. 1.
Figure 3:
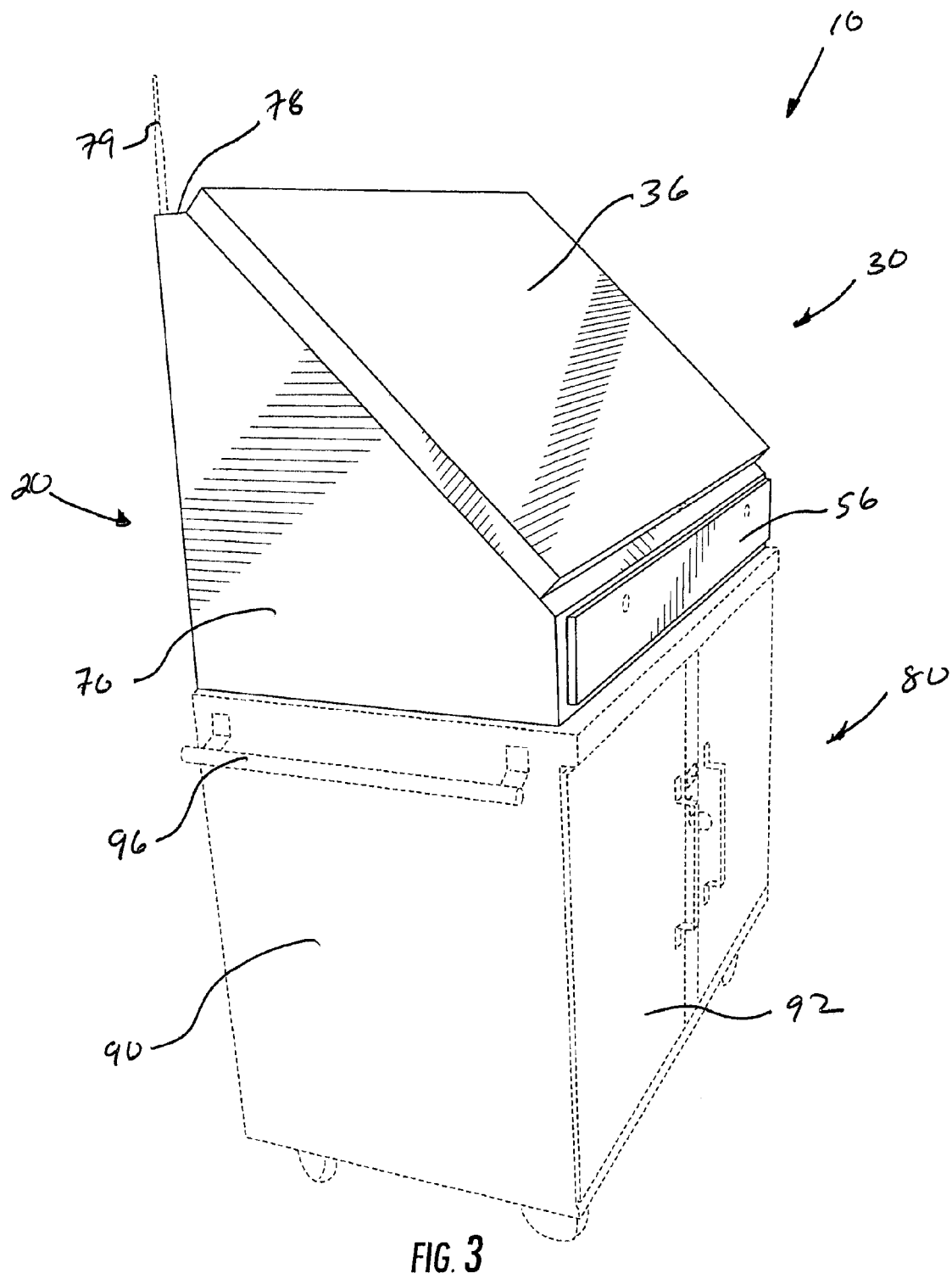
FIG. 3 is a perspective side view of the field access station of FIG. 1.
Figure 4:
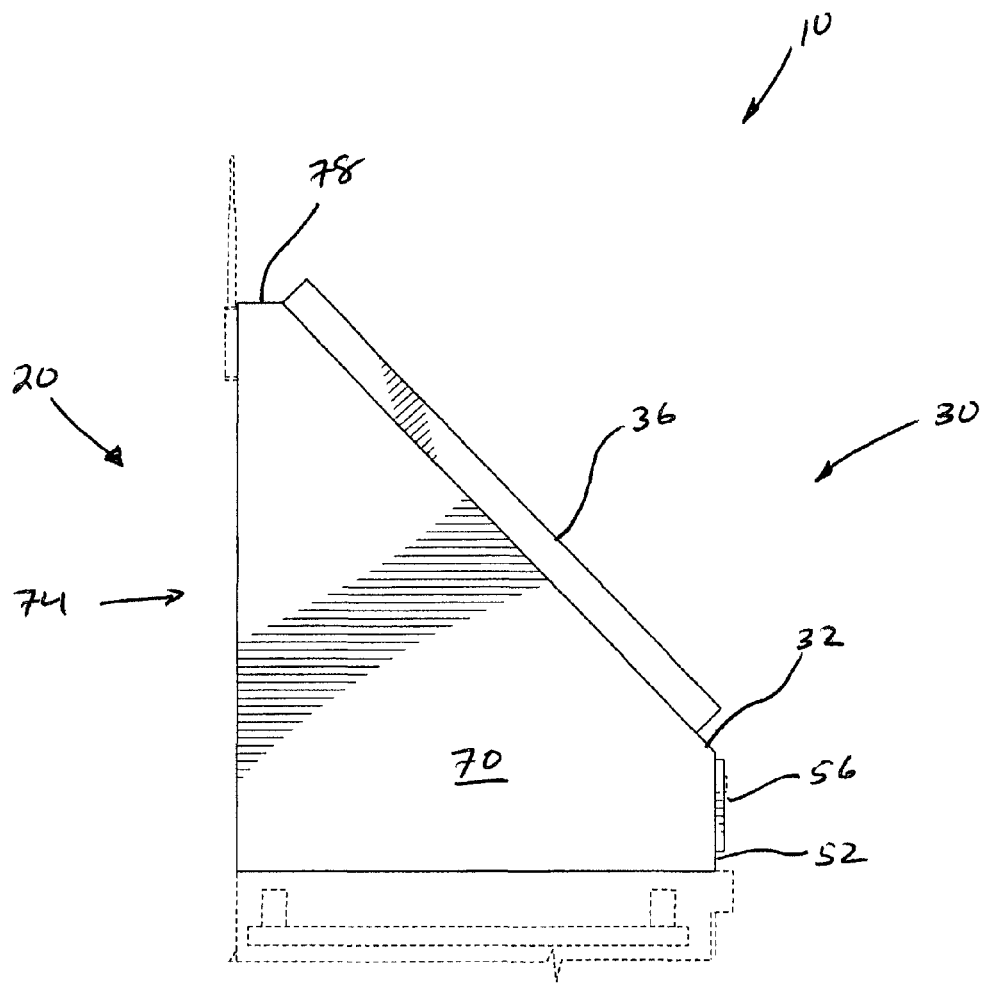
FIG. 4 is a close-up side view of the field access station of FIG. 1.
Figure 5:
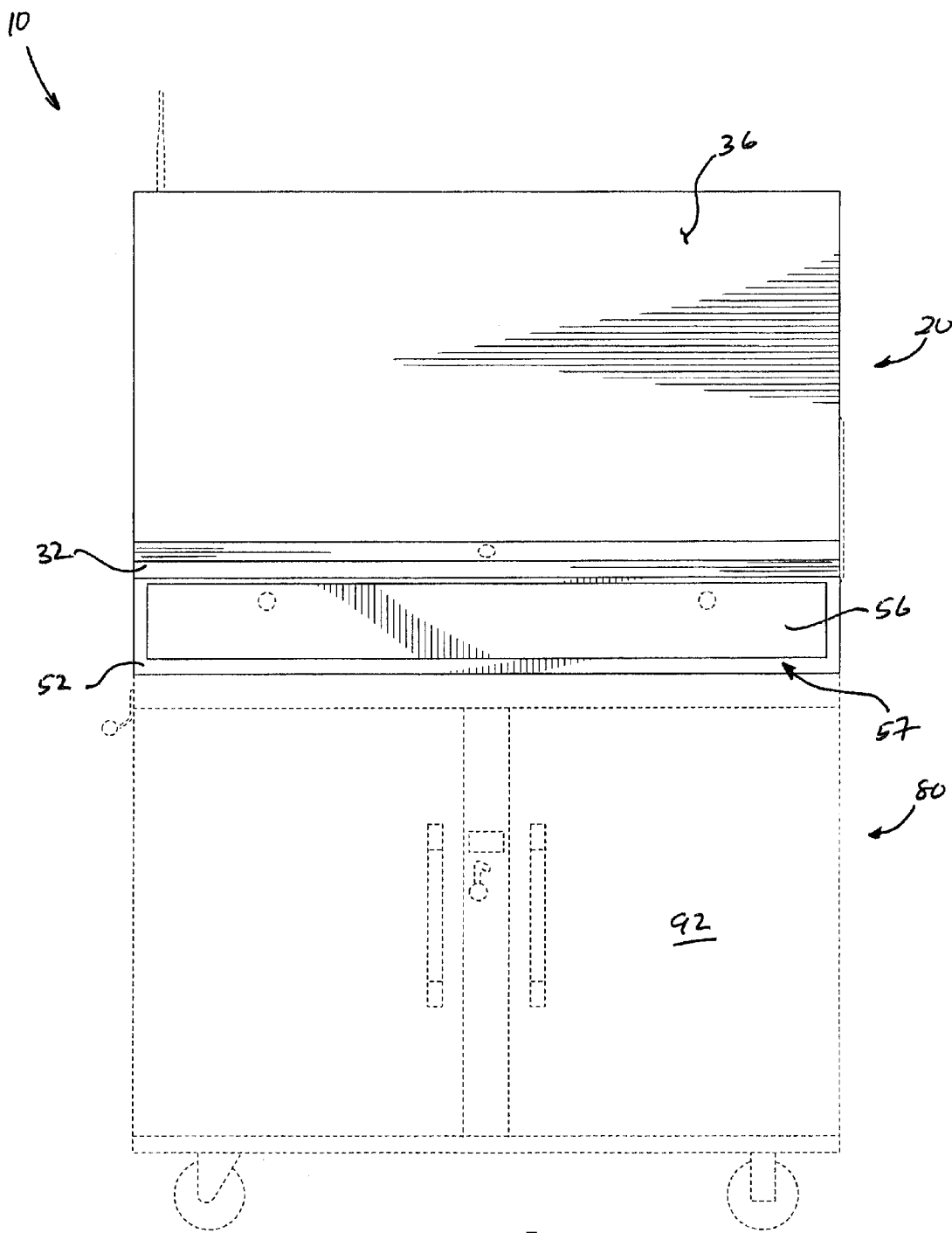
FIG. 5 is a close-up front view of the field access station of FIG. 1.
Figure 6:
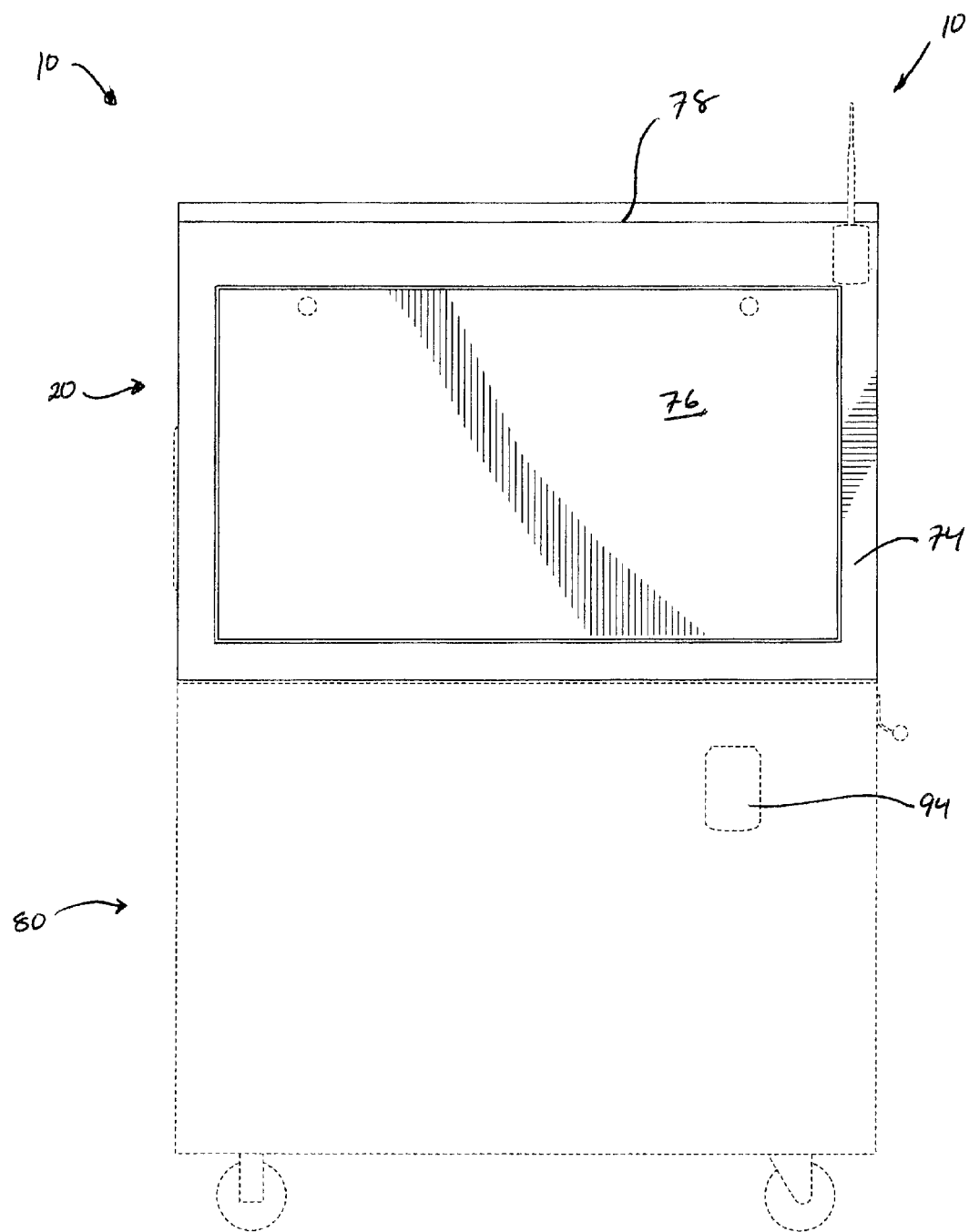
FIG. 6 is a close-up rear view of the field access station of FIG. 1.

As shown in FIGS. 1 and 2, at least one of the side panels 70 can include an intake vent 72 and vent cover 73 which covers and protects the intake to a blower. The back panel 74 can include an access door 76 that is sealable around its perimeter and which can also be locked. The top panel 78 may have provision for a communication antennae 79 extending there through, but otherwise can be a continuous surface configured to provide protection from precipitation and falling objects. In one aspect, each of the panels can be made from a heavy-gauge metal material, such as from carbon steel, a steel alloy, or aluminum and the like, which can provide protection from all but the most serious of accidents or attacks. Alternatively, the panels may be made from a polymer or composite material, such as carbon fiber, which may be selected both for its structural integrity and resistance the elements as well as its density and weight that is significantly less than that of steel, allowing for an movable access station that is easier to move about.

The enclosure 20 of the field access station can be movable or transportable between job sites, where it may be mounted or bolted to the top of a workbench, desk, or similar base-like structure. The enclosure 20 of the field access station may also be mounted to a desk or table within a job site trailer. Preferably, and as shown in FIGS. 1-11, the enclosure 20 of the field access station can securely mounted or bolted to the top of a base enclosure 80, such as a rolling gang box commonly found at construction sites, to form a mobile field access station 10 which is easily movable around the job site to any location having access to a source of electrical power.

In other words, the rolling base enclosure 80 or gang box can provide the structural support for elevating the enclosure 20 to a height that is convenient to access when in use, and also provide the mobility to roll the mobile field access station 10 around to various locations throughout the job site. In addition, the base enclosure 80 can provide additional mass which reduces the height of the center of gravity of the combined enclosure 20/base enclosure 80 assembly, to minimize the likelihood of tipping and falling. The exterior of the base enclosure 80 can include locking and/or pivoting rollers 88 at the lower corners and one or more side handles 96 for moving and guiding the mobile access station 10 about the job site or facility.

As shown, the base enclosure 80 can be sized to elevate the enclosure 20 to a convenient height for working while standing, such as when the tray cover 56 mounted to the vertical portion 52 of the front panel is positioned at height between about 32 inches and about 40 inches above a ground surface. In such a configuration, the screen of the display device is positioned at a height that is easily viewable by a group of individuals standing around the field access station, and the laptop and other electronic input devices supported on the tray are also easily accessible. In an alternative embodiment, the enclosure 20 may positioned to a reduced height that is easier to work with while sitting. In either aspect, an optional folding stool or seat rest (not shown) can be incorporated into the base enclosure 80, and which can be extended to allow a user to work at the field access station while seated.

The base enclosure 80 can include a plurality of solid panels 90 and a set of doors 92 (or drawers) which together define one or more additional secondary compartment spaces for storage, which can be accessed through the doors 92 in the front panel or one or more access ports 94 formed in the side or back panels of the base enclosure 80. In one aspect, a conduit 150 (see FIG. A-20) can be installed between the central compartment in the enclosure 20 and the secondary compartment(s) in the base enclosure 80, to provide passage for communication cables and power cables. This allows for the optional storage of additional electronic components of the field access station 10 within the secondary compartment(s) in the base enclosure 80, such as an Uninterruptable Power Supply (UPS). The UPS may include an Automatic Voltage Regulator (AVR) and surge protections, which can condition the power to the electronic components to desired performance characteristics. The provision of a UPS/AVR can be helpful in the event that electrical power to the field access station 10 is easily interrupted or is prone to fluctuation and spikes which can cause damage to the sensitive electronic components, occurrences that are common at construction sites.

Other electronic components may be added to the base enclosure 80 include a computer device, a printer, a modem, a wireless router and the like. The computer device can have suitable processor and storage capabilities that aid in performing and storing the necessary calculations and updates to data used on the station. Further, the modem or wireless router can facilitate communications to remote stations located elsewhere on the job site or to stations or computers located away from the job site.

In certain embodiments, the top panel of the base enclosure 80 may also serve as the bottom panel of the enclosure 20, with provision that the bottom edges of each of the front panel 30, the side panels 70 and the back panel 74 include a surface and sealing material for forming a substantially air-tight seal between the bottom edges of the panels and the top panel of the base enclosure 80.

Figure 7:
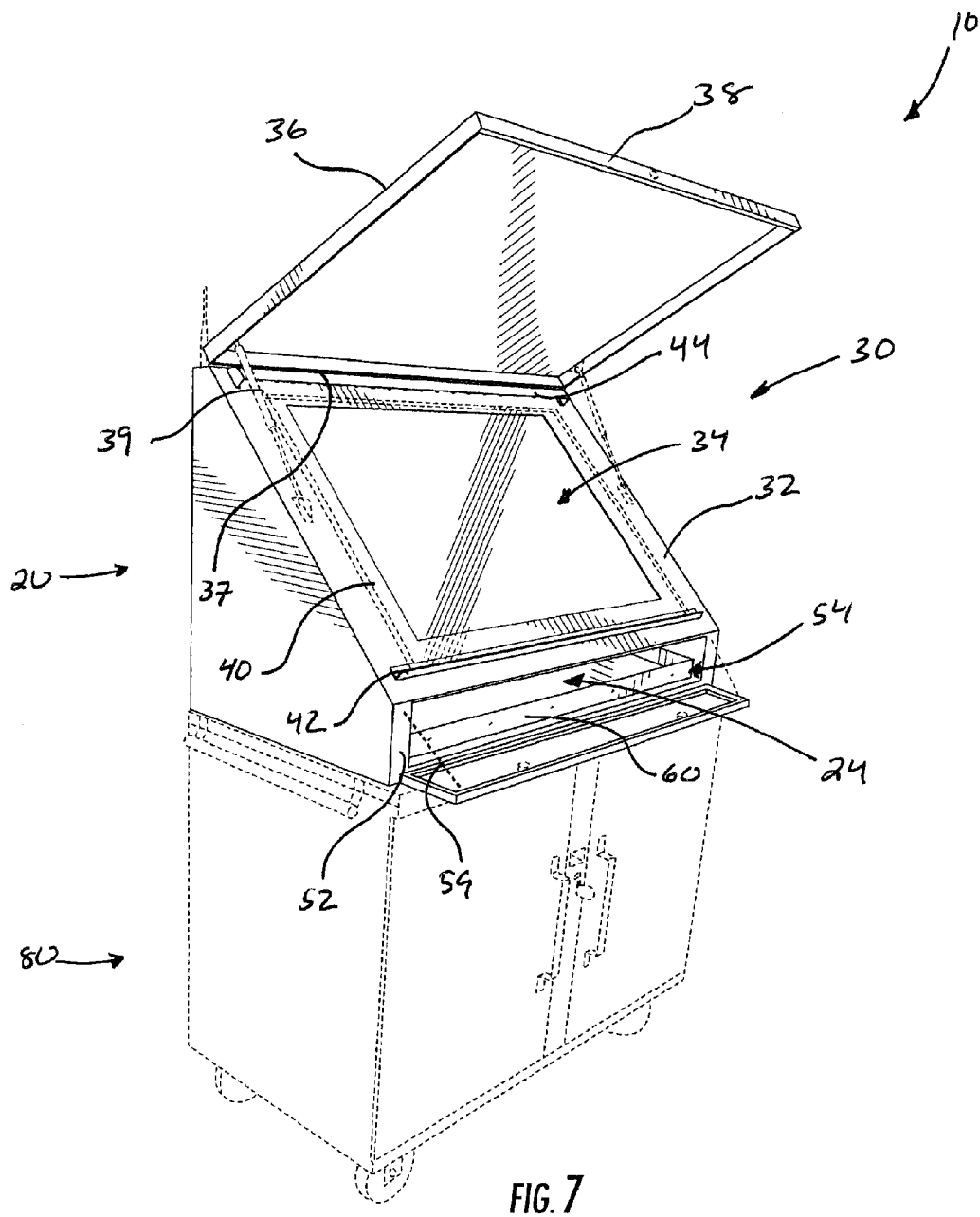
FIG. 7 is a perspective left-side view of the field access station of FIG. 1 in an open configuration.
Figure 8:
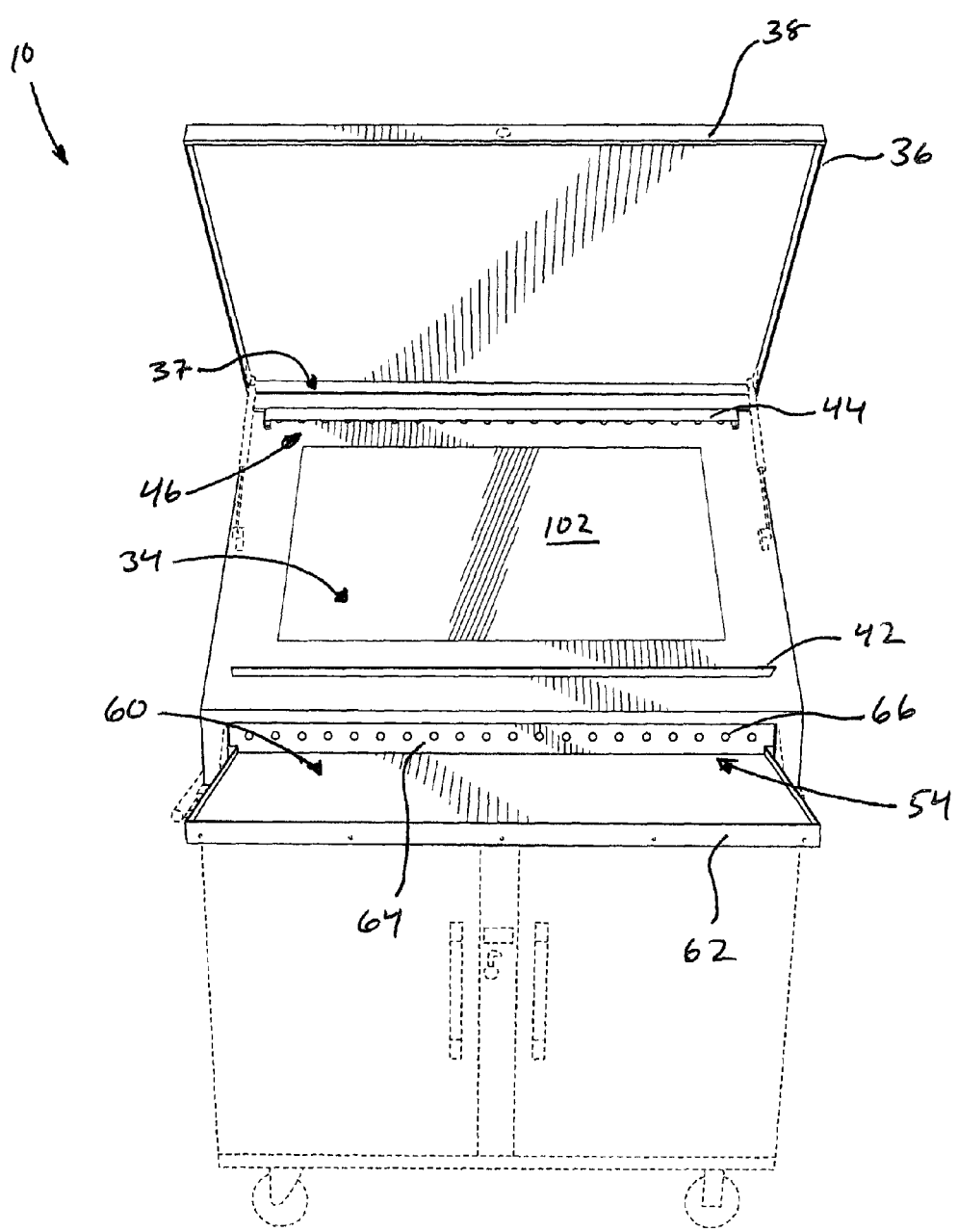
FIG. 8 is a perspective front view of the field access station of FIG. 1 in an open configuration.
Figure 9:
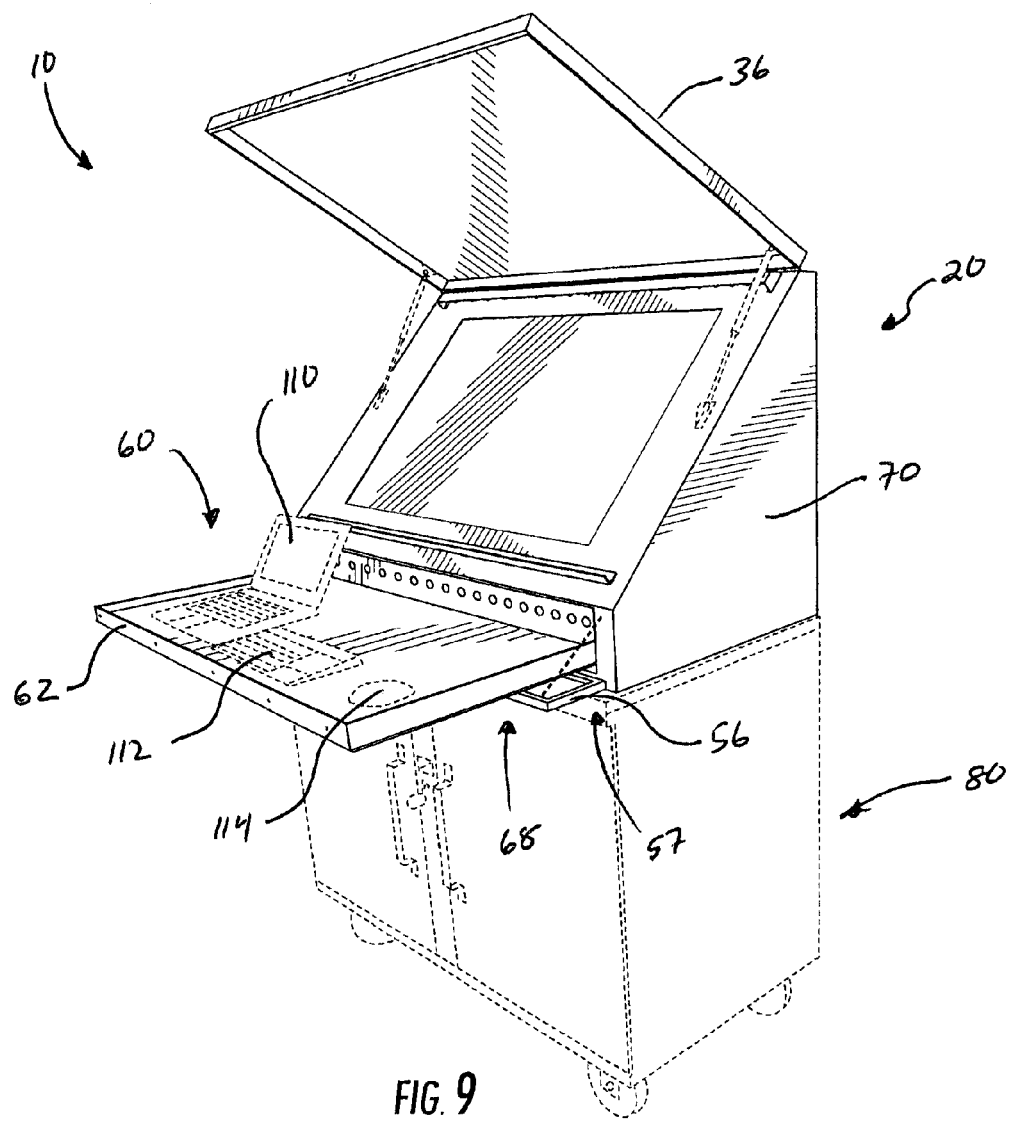
FIG. 9 is a perspective right-side view of the field access station of FIG. 1 in an open configuration.

Referring now to FIGS. 7-9, the screen cover 36 can include a hinge 37 along its top edge that allows the bottom portion of the screen cover 36 to pivot upwards when opened. The screen cover 36 can be supported in the open position with gas or pneumatic supports 39, and at an angle which provides a measure of protection against falling objects as well as shade from bright light sources. The screen cover 36 in the open position can also provide wind protection to one or more individuals using the field access station 10, which can be very beneficial at times when the wind becomes a significant nuisance, and in particular during the beginning stages of a construction project up until the exterior of the building is enclosed (if ever).

With the screen cover 36 in the open position, one can see the screen aperture 34 formed into the angled portion 32 of the front panel 30, the screen 102 of a display device 100 which has been installed directly beneath the screen aperture 34, and an optional transparent panel 40 which overlies the screen aperture 34 and the display device 100. One can also see a guide channel 42 below the screen aperture 34, as well as an air diverter 44 and a plurality of upper outlet holes 46 formed into the angled portion 32 above the screen aperture 34.

Figure 10:
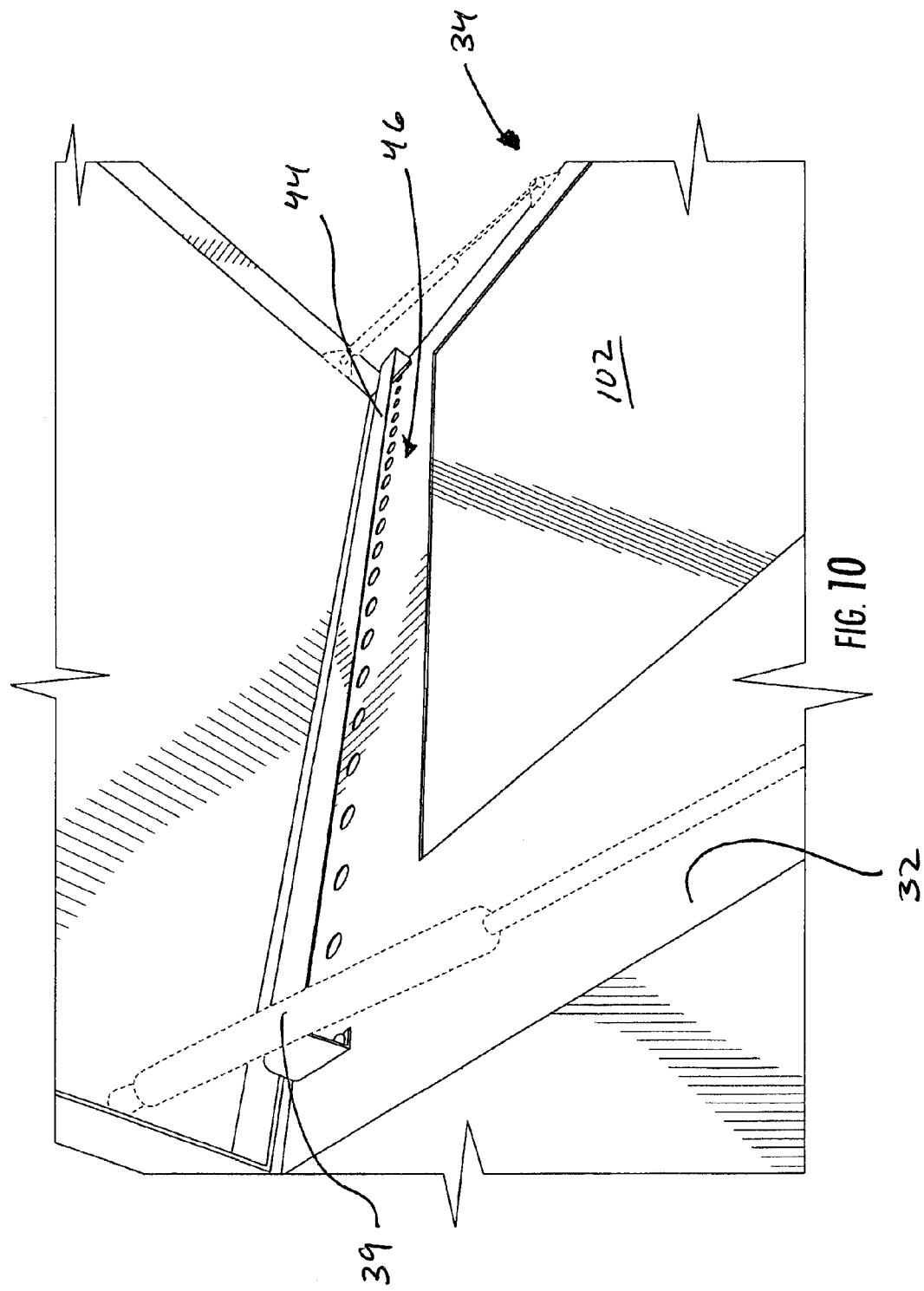
FIG. 10 is a close-up view of the upper outlet holes and air diverter of the field access station of FIG. 1 in an open configuration.
Figure 11:
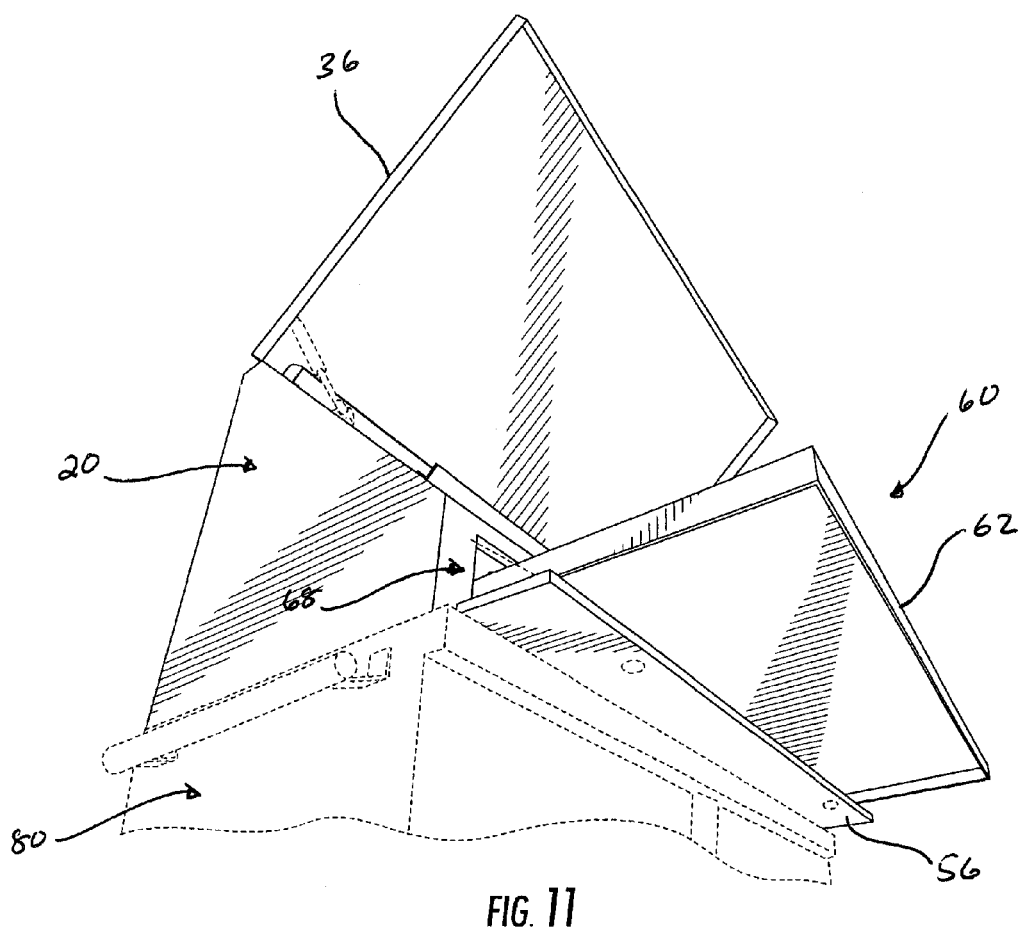
FIG. 11 is a perspective underside view of the tray of the field access station of FIG. 1 in an open configuration.

The air diverter 44 and upper outlet holes 46 are illustrated with greater detail in FIG. 10. As will be discussed below, the upper outlet holes 46 and air diverter 44 can be configured to direct pressurized air exiting the enclosure 20 to flow downwardly over the screen 102 of the display device 100 or the front surface of the transparent panel 40.

In FIG. 7, the tray cover 56 is also shown in the open position, but with the tray 60 still in a retracted position within the central compartment 24 of the enclosure 20. The tray cover 56 can include a hinge 57 along its lower edge that allows the top portion of the tray cover 56 to pivot downwards when open. The tray cover 56 can be supported in the open position with chain supports 59 or similar-acting structures. Once opened, the tray cover 56 exposes a tray aperture 54 formed into the vertical portion 52 of the front panel, along with the front portion of a raised lip 62 of a tray 60.

As illustrated in FIGS. 8-9, the tray 60 can include a telescoping support system 68 which allows the tray 60 to be slidably withdrawn from its retracted position within the enclosure 20 to an extended position outside of the enclosure. The tray 60 and its support system 68 can be sized and configured to provide full support for a laptop computer 110 and additional input devices for the field access station, including a computer keyboard 112, a computer mouse pointing device 114, and the like. The tray 60 and its telescoping support system 68 are shown in greater detail in FIG. 11. The ability to retract the tray either when a keyboard or other peripheral computer equipment is not needed used or when the station is not in use helps reduce the size of the footprint of the station to avoid interfering with other persons working at a construction site.

The tray 60 also includes a back panel 64 which abuts and seals against the inside perimeter of the tray aperture 54 when the tray is in the extended position, as shown in FIGS. 8-9. The back panel 64 of the tray 60 includes a plurality of lower outlet holes 66 formed therein. As will be discussed below, the lower outlet holes 66 are configured to direct filtered, pressurized air exiting the enclosure to pass over the top of the components supported on the tray 60.

Referring now to FIGS. A-17, A-19, and A-21 through A-23, the enclosure 20 of the field access station 10 can include one or more air blowers 120. When the enclosure 20 is placed in its open configuration, the air blower(s) 120 are configured to draw in air from outside the enclosure 20 through the one or more intake vents 72 and vent covers 73 formed into the side panels 70, and to compress or pressurize the air within the central compartment 24. Consequently, with the enclosure 20 being substantially sealed except for the upper outlet holes 46 and the lower outlet holes 66, an air circulation pattern can be established within the enclosure 20 which both cools the components within the enclosure and provides for a steady flow of air out of the enclosure through the lower outlet holes 66 and/or the upper outlet holes 46, and over the top of the exposed components outside of the enclosure 20. These directed flows of air outside the enclosure can operate to both cool the external components and to divert any dust or other particulate matter from falling on the exposed surfaces.

In addition, the one or more air blowers 120 can draw in air from the outside the enclosure 20 through an air filter 122. The air filter(s) can screen the air entering the enclosure 20 from particulate matter, excess moisture, and other harmful airborne impurities which may be found in and around the construction or manufacturing site. Thus, both the cooling air circulating within the enclosure 20 and the air flows exiting the enclosure can be filtered, which further reduces the likelihood that the dust, excess moisture or other impurities will come into contact with the electronic components housed within or supported by the field access station 10.

In another embodiment the direction of air circulation can be reversed, with the blower drawing air in through the upper set of holes in the front panel and the lower set of holes in back panel of the tray, and exhausting the air out through the side vent. In this case, air filters can be installed over the upper holes in the front panel and lower holes in the back panel of the tray. In addition, moisture barriers which are permeable to air but resistant to the passage of water droplets and the like may be mounted adjacent to the upper outlet holes 46 and to the lower outlet holes 66, so to prevent the passage of water droplets and moisture into the interior 24 of the enclosure 20 during a heaving rain, an inadvertent spraying of the enclosure, the accidental spilling of beverages on the tray, and the like.

In another embodiment of the disclosure (see FIG. A-18), the enclosure 20 can include a dehumidifier 170 for withdrawing moisture from the cooling air circulating throughout the enclosure, so as to reduce the potential for condensation on or within the electronic components. This aspect can be especially useful in high-humidity environments. The dehumidifier may be passive or active. For instance, a passive dehumidifier can include one or more disposable desiccants, such as granules of calcium chloride, for withdrawing the moisture from the air. An active dehumidifier 170, such as an electric refrigerative or an electronic heat pump-based unit, may also be installed within the enclosure 20 and can include drain tubing 172 which passes through the base of enclosure 20 to connect with a drain extending from the base enclosure.

Referring back to FIGS. 1-6, with the screen cover 36 returned to its closed position, each of the screen aperture 34, the transparent panel 40, the channel guide 42 and the air diverter 46 can be completely enclosed within the volume defined by the angled portion 32 of the front panel, the panel of the screen cover 36, and the raised lip 38 of the screen cover. Likewise, with the tray 60 returned to its retracted position and the tray cover 56 moved to its closed position, the tray and all its components are completely enclosed within the central compartment of the enclosure 20.

As a result, in the closed state or configuration illustrated in FIGS. 1-6, the field access station 10 can support and protect the various electronic components housed therein from dust and other harmful impurities with one or more solid layers of protection. In the open state or configuration illustrated in FIGS. 7-9, moreover, the field access station 10 can continue to support and protect the electronic components from dust and other harmful impurities with either a solid barrier or with a flowing air barrier, such as the flowing barrier of filtered air described above.

Additional features and aspects of the various components which comprise the field access station 10 of the present disclosure will now be discussed with reference to the drawings included in Appendix A and Appendix B.

With reference to FIGS. A-2, A-8, and A-9, the access port 94 in the back panel of the base enclosure 80 can include an electrical connection device for connecting the field access station 10 to an electrical power supply without opening any panels or ports in the enclosure 20 or base enclosure 80.

With reference to FIGS. A-7 and A-15, the lip 62 of the tray 60 can be formed from a metallic strip which surrounds both the front and sides of the tray and has an upper edge which is raised far enough above the surface of the tray 60 to prevent objects from sliding off or falling off if inadvertently knocked by a user.

With reference to FIGS. A-10 and A-11, the display device 100 can be a flat panel television. In some aspects, the display screen of the flat panel television can have a diagonal dimension of about 40 inches or greater.

With reference to FIG. A-10, the access door 76 in the back panel 74 of the enclosure 20 can be sealed against the pressurized air in central compartment with a stripping material 130.

With reference to FIGS. A-18 and A-19, the telescoping support system 68 for the tray 60 can comprise sliding rails with linear bearings 140. The rails can include a detent which holds and secures the tray 60 in its extended position while simultaneously compressing the stripping material 130 attached to the inside perimeter of the tray aperture 54 (FIGS. A-29, A-30).

With reference to FIGS. A-19 and A-21, the blower 120 may be a radial cage blower, axial fan blower, and the like. The blower may be sized to provide an air flow between about 100 CFM and about 300 CFM.

With reference to FIGS. A-20 and A-28, the field access station 10 may include an automatic cutoff switch 124 which cuts off power to the blower when the tray 60 is pushed into its retracted position within the enclosure 20. Other automatic cutoff switch configurations are also possible, included a cutoff switch associated with the screen cover.

With reference to FIG. A-22, the air filter 122 may be a fine particulate matter filter, an electrostatic air filter, and the like.

With reference to FIG. A-24, the field access station 10 can include a wireless connection interface 160 for establishing electronic communication with a remote device.

With reference to FIGS. A-27 and A-28, the conduit opening 150 between the central compartment 24 of the enclosure 20 and the secondary compartment(s) of the base enclosure 80 can be sized to allow for a flow of pressurized air there through, in order to provide cooling for the components stored in the gang box. In an embodiments of the field access station 10 where the doors 92 of the base enclosure 80 are not sealed around their perimeters 93, the pressured air can exit from gaps formed around the edges of the doors (see FIG. A-41). In an embodiment of the field access station 10 where the doors 92 of the base enclosure 80 are sealed, however, additional vent holes (not shown) can be providing in the base enclosure 80 for establishing the circulation of air there through.

With reference to FIG. A-31, the display device 100 can seal against an insider perimeter of the screen aperture 34 with a stripping material 130. In other aspect, the transparent panel may be sealed against the outside perimeter of the screen aperture with a stripping material.

With reference to FIGS. A-31, A-37 and A-38, the enclosure 20 can include a base bracket 104 for securing the base of the display device 100. The base bracket can include a resilient material 106 for cushioning the display device within the base bracket 104. The enclosure can further include a top bracket 108 (FIGS. A-37, A-39) also having a resilient material for cushioning the display device.

With reference to FIGS. A-35 and A-36, the transparent panel 40 can comprise a transparent Lexan screen having in one embodiment a thickness between about ¼ inch to about ¾ inch. Such a transparent panel can help avoid damage to the screen 102 of the electronic display device from falling objects.

With reference to FIG. A-36, the transparent panel 40 can include a cutout portion 41 to accommodate one side of the channel guide 42. The projecting lip of the guide channel 42 can be sized to simultaneously support the bottom edge of the transparent panel 40 and hardcopies of large-format drawings resting on top of the transparent panel 40, as well as notebooks, tablet computers and writing instruments.

With reference to FIG. A-41, the secondary compartment(s) 84 of the base enclosure 80 can sized and configured to hold a plurality of electronic components for the field access station 10. As discussed above, in one aspect the perimeter edges 93 of the doors 92 may be sealed with a stripping material (not shown) similar to that used in the enclosure 20. This additional sealing can provide protection from suspended particulates and moisture from infiltrating the base enclosure 80 during the closed configuration and storage.

What is claimed is:

1. A system for displaying construction documents in electronic format in a high-dust industrial environment, the system comprising:
    an enclosure for housing a display screen and sealable from dust, the enclosure being sealable to minimize dust infusion and including:
        a front panel, a top panel, a back panel, and two side panels, each of the panels being coupled to an adjacent panel with a sealed edge to form a sealed enclosure, at least one of the panels including an intake vent to allow a flow of intake air there through;
        a first aperture in the enclosure for viewing an electronic display;
        a transparent pane mounted over the first aperture for viewing the electronic display there through;
        a second aperture in the enclosure for accessing an interior of the enclosure;
        a movable cover mounted over the second aperture and sealable around an outside perimeter of the second aperture in a closed position and movable to expose the second aperture in an open position;
    an electronic display mounted within in the enclosure and visible through the first aperture;
    a blower associated with the intake vent and having an air filter, the blower being operable to direct an intake flow of air through the air filter and into the enclosure; and
    a tray slidably mounted at the enclosure and extendable from a retracted position within the enclosure through the second aperture to an extended position, the tray having a rear panel operable to seal against an inside perimeter of the second aperture with the tray in an extended position, the rear panel having a plurality of outlet holes formed therein and configured to direct an outlet flow of filtered air over the tray.

2. The system according to claim 1, wherein the enclosure further comprises:
    a second plurality of outlet holes formed in the enclosure
    an air diverter mounted proximate the second plurality of outlet holes and configured to direct a second outlet flow of filtered air over the transparent pane; and a second movable cover configured to seal over the second plurality of outlet holes in a closed position and to expose the second plurality of outlet holes in an open position.

3. The system according to claim 1, wherein the enclosure further comprises a blower cut-out switch configured to remove power to the blower with the tray in the retracted position.

4. The system according to claim 1, wherein the enclosure is itself a movable cart, or is coupled to a movable cart.

5. The system according to claim 1, further comprising a computer device located in the tray and in electrical communication with the electronic display.

* * * * *